United States Patent
Chang (10) Patent No.: US 9,185,792 B2
(45) Date of Patent: Nov. 10, 2015

(54) PACKAGE SUBSTRATE AND ELECTRONIC ASSEMBLY

(71) Applicant: Chih Ming Chang, Taipei (TW)

(72) Inventor: Chih Ming Chang, Taipei (TW)

(73) Assignee: MUTUAL-TEK INDUSTRIES CO. LTD., Xinzhuang (TW)

( * ) Notice: Subject to any disclaimer, the term of this patent is extended or adjusted under 35 U.S.C. 154(b) by 227 days.

(21) Appl. No.: 13/961,878

(22) Filed: Aug. 7, 2013

(65) Prior Publication Data

US 2014/0168899 A1 Jun. 19, 2014

(30) Foreign Application Priority Data

Dec. 14, 2012 (TW) .............................. 101147609 A (51) Int. Cl.
| | | |
|---|---|---|
| H05K 7/20 | (2006.01) | |
| H05K 1/02 | (2006.01) | |
| G06F 1/20 | (2006.01) | |
| H05K 3/00 | (2006.01) | |
| H05K 3/46 | (2006.01) | |

(52) U.S. Cl.
CPC .............. *H05K 1/0204* (2013.01); *H05K 1/021* (2013.01); *H01L 2224/48091* (2013.01); *H01L 2224/73265* (2013.01); *H05K 3/0061* (2013.01); *H05K 3/4691* (2013.01)

(58) Field of Classification Search
CPC ......... H05K 7/20; H05K 1/02; H05K 7/2039; H05K 1/0204; G06F 1/20; G06K 19/06; H01L 23/34; H01L 23/10; H01L 23/48; H01L 23/52; H01L 21/44
USPC ............. 361/679.46, 679.54, 679.55, 679.56, 361/690–694, 704–712, 715–721, 736, 361/752; 165/80.2, 80.3, 80.4, 104.33, 185, 165/121, 122; 174/15.1, 16.1, 252; 257/706, 712, 713, 718–724, 692, 99, 257/100; 438/106–118, 125
See application file for complete search history.

(56) References Cited

U.S. PATENT DOCUMENTS

| | | | | |
|---|---|---|---|---|
| 5,583,378 A | * | 12/1996 | Marrs et al. ................... | 257/710 |
| 5,955,782 A | * | 9/1999 | Kosteva et al. ............... | 257/720 |
| 6,020,637 A | * | 2/2000 | Karnezos ....................... | 257/738 |
| 6,118,178 A | * | 9/2000 | Takeuchi ....................... | 257/707 |
| 6,537,848 B2 | * | 3/2003 | Camenforte et al. ......... | 438/106 |
| 6,566,166 B2 | * | 5/2003 | Chien ........................... | 438/108 |

(Continued)

FOREIGN PATENT DOCUMENTS

| | | | | |
|---|---|---|---|---|
| EP | 000463871 A2 | * | 1/1992 | ......... G06K 19/0773 |
| TW | 200421576 | | 10/2004 | |
| TW | 200742120 | | 11/2007 | |

*Primary Examiner* — Michael V Datskovskiy (74) *Attorney, Agent, or Firm* — Raymond J. Ho, Esq.; IP Law Leaders PLLC (57) ABSTRACT

A package substrate including a circuit board and a heat-dissipating element is provided. The circuit board has a through opening adapted for accommodating an electronic element. The heat-dissipating element is disposed at the circuit board and covers one side of the through opening. The heat-dissipating element includes a heat-dissipating plate, an adhesive layer and an antioxidation layer. The heat-dissipating plate has a first surface facing the through opening and a second surface opposite to the first surface. The adhesive layer is disposed on the first surface and the heat-dissipating plate adheres to the circuit board through the adhesive layer. The antioxidation layer is disposed on the second surface. An electronic assembly including the package substrate is also provided.

15 Claims, 5 Drawing Sheets

(56) References Cited

U.S. PATENT DOCUMENTS

| | | | |
|---|---|---|---|
| 6,670,219 B2* | 12/2003 | Lee et al. | 438/107 |
| 6,706,564 B2* | 3/2004 | Kim et al. | 438/125 |
| 6,744,125 B2* | 6/2004 | Camenforte et al. | 257/678 |
| 6,894,384 B1* | 5/2005 | Shizuno | 257/712 |
| 7,169,643 B1* | 1/2007 | Hashimoto | 438/110 |
| 2006/0273458 A1* | 12/2006 | Huang et al. | 257/734 |
| 2007/0252157 A1 | 11/2007 | Chang et al. | |

* cited by examiner

PACKAGE SUBSTRATE AND ELECTRONIC ASSEMBLY

CROSS REFERENCE TO RELATED APPLICATIONS

This application claims the right of priority based on Taiwan Patent Application No. 101147609 entitled "PACKAGE SUBSTRATE AND ELECTRONIC ASSEMBLY" filed on Dec. 14, 2012, which is incorporated herein by reference and assigned to the assignee herein.

FIELD OF THE INVENTION

The present invention is related to a carrier and particularly related to a package substrate and an electronic assembly including the package substrate.

BACKGROUND OF THE INVENTION

In general, a conventional circuit board for carrying and electrically connecting a plurality of electronic components substantially comprises circuit layers and dielectric layers that are stacked alternately. Each of the circuit layers are defined and formed by performing a patterning process on a conductive layer. Each of the dielectric layers is disposed between adjacent ones of the circuit layers in order to space apart the adjacent circuit layers. In addition, each of the stacked circuit layers may be electrically connected to another by a conductive via. Furthermore, various electronic components (such as active components or passive components) can be disposed on a surface of the circuit board, and electrical signal propagation is achieved by means of an internal circuit of the circuit board.

Due to miniaturization of any of electronic products, the application of circuit boards rapidly increases; for example, circuit boards can be applied in mobile phones and notebook computers. However, given the trend toward miniaturized electronic products, it is required to improve the heat dissipation efficiency of an electronic element electrically connected to a circuit board.

SUMMARY OF THE INVENTION

The present invention provides a package substrate which can enhance the heat dissipation efficiency of an electronic element mounted thereon.

The present invention provides a method for manufacturing a package substrate by means of which the heat dissipation efficiency of an electronic element mounted on the package substrate can be enhanced.

The present invention provides an electronic assembly of which a package substrate can enhance the heat dissipation efficiency of an electronic element mounted thereon.

The present invention provides a package substrate including a circuit board and a heat-dissipating element. The circuit board has a through opening adapted for accommodating an electronic element. The heat-dissipating element is disposed at the circuit board and covers one side of the through opening. The heat-dissipating element includes a heat-dissipating plate, an adhesive layer and an antioxidation layer. The heat-dissipating plate has a first surface facing the through opening and a second surface opposite to the first surface. The adhesive layer is disposed on the first surface and the heat-dissipating plate adheres to the circuit board through the adhesive layer. The antioxidation layer is disposed on the second surface.

In an embodiment of the present invention, the heat-dissipating plate is a metal foil of which a thickness is between 3 to 100 microns.

In an embodiment of the present invention, the adhesive layer is a heat conductive adhesive layer.

In an embodiment of the present invention, the antioxidation layer is a metal layer.

In an embodiment of the present invention, the antioxidation layer is a solidified resin layer.

The present invention also provides an electronic assembly including the package substrate and an electronic element. The electronic element is disposed on the heat-dissipating element, at least partially located in the through opening and electrically connected to the circuit board.

The present invention further provides a method for manufacturing a package substrate including the following steps. First, a circuit board is provided. The circuit board has a through opening adapted for accommodating an electronic element. Next, a heat-dissipating plate is provided. The heat-dissipating plate has a first surface and a second surface opposite to the first surface. Next, an adhesive layer is formed on the first surface. Next, an antioxidation layer is formed on the second surface, wherein a heat-dissipating element is composed of the heat-dissipating plate, the adhesive layer and the antioxidation layer. Afterwards, the heat-dissipating plate adheres to the circuit board through the adhesive layer such that the heat-dissipating element covers one side of the through opening.

In an embodiment of the present invention, the antioxidation layer is a metal layer and the antioxidation layer is formed on the second surface by means of electroplating, sputtering, physical vapor deposition or chemical vapor deposition.

In an embodiment of the present invention, the antioxidation layer is a solidified resin layer. The antioxidation layer is formed on the second surface by applying a resin material to the second surface and then heating the resin material or irradiating the resin material with ultraviolet light.

The package substrate has the heat-dissipating element corresponding to the through opening of the circuit board. The electronic element is located in the through opening and on the heat-dissipating element. Hence, in view of the trend toward miniaturized electronic products, the heat dissipation efficiency of the electronic element of the electronic assembly of this embodiment of the present invention is enhanced. In addition, since the heat-dissipating plate of the heat-dissipating element can be a metal foil, the total weight of the package substrate of this embodiment can be reduced. Furthermore, since the heat-dissipating element has the antioxidation layer disposed on the heat-dissipating plate, the heat-dissipating plate is protected by the antioxidation layer and thus unlikely to come into contact with ambient moisture to oxidize.

The following description, the appended claims, and the embodiments of the present invention further illustrate the features and advantages of the present invention.

DETAILED DESCRIPTION OF THE INVENTION

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as to not unnecessarily obscure the embodiments of the invention. Any devices, components, materials, and steps described in the embodiments are only for illustration and not intended to limit the scope of the present invention.

[First Embodiment]

Figure 1:
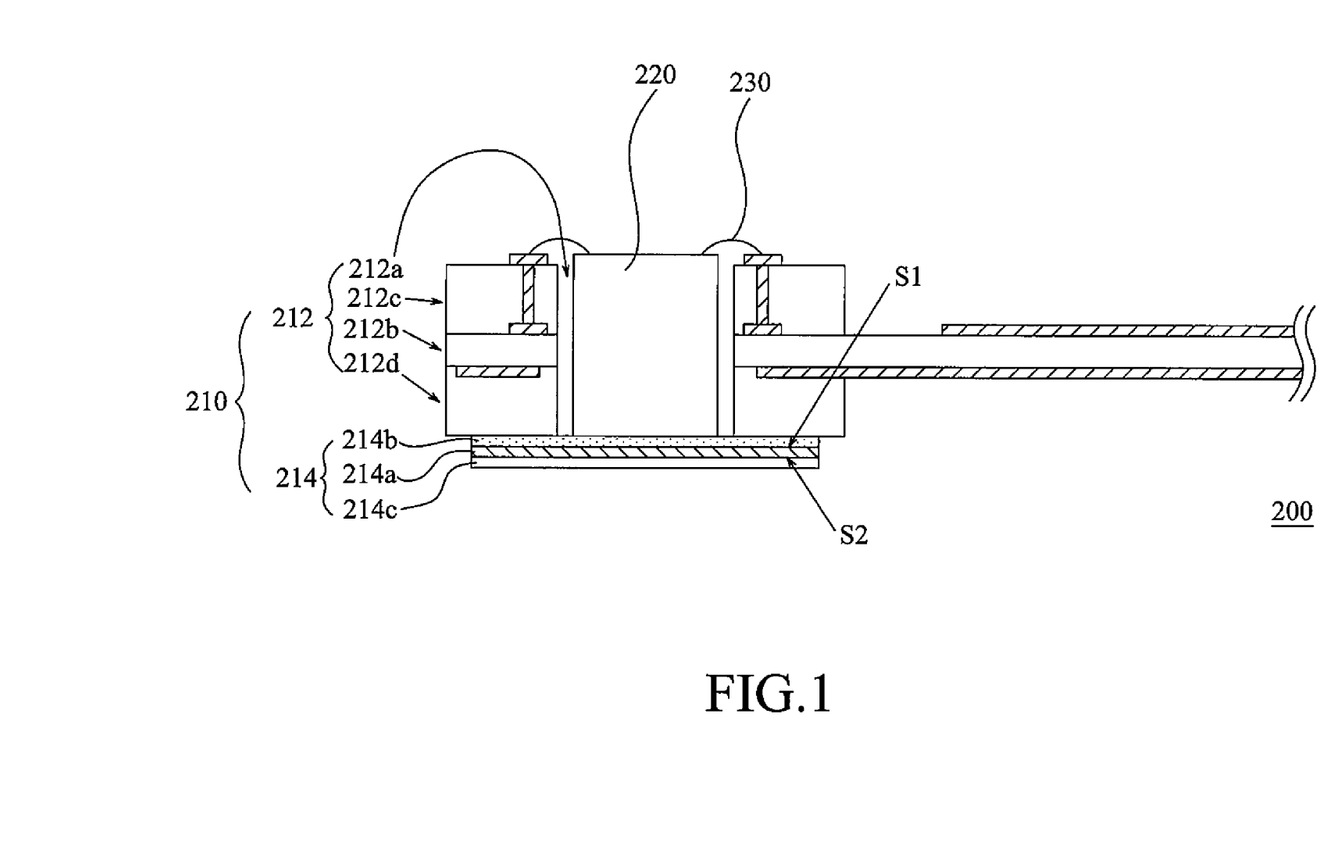
FIG. 1 is a schematic cross-sectional view of an electronic assembly according to the first embodiment of the present invention.

FIG. 1 is a schematic cross-sectional view of an electronic assembly according to the first embodiment of the present invention. Referring to FIG. 1, an electronic assembly 200 of this embodiment comprises a package substrate 210 and an electronic element 220. The package substrate 210 comprises a circuit board 212 and a heat-dissipating element 214. The circuit board 212 has a through opening 212a adapted for accommodating the electronic element 220. In this embodiment, the circuit board 212 is, for example, a combined circuit board, which comprises a flexible circuit board 212b, a rigid circuit board 212c, and a rigid dielectric layer 212d. The rigid circuit board 212c and the rigid dielectric layer 212d are disposed on two opposing sides of the flexible circuit board 212b, respectively. The circuit board 212 such as the combined circuit board is formed by means of thermal compression. In another embodiment, the circuit board 212 is merely a rigid circuit board.

The difference between a rigid circuit board and a flexible circuit board is that the material of the rigid dielectric layer of the rigid circuit board is different from the material of the flexible dielectric layer of the flexible circuit board. For example, the material of the rigid dielectric layer includes glass fibers and resin. The material of the rigid dielectric layer may be a composite material made up of bismaleimide-triazine resin (BT resin) and glass fibers, or another composite material such as FR-4 or FR-5 made up of epoxy resin and glass fibers. The material of the flexible dielectric layer is, for example, polyimide (PI) resin or epoxy resin. It should be noted that the rigidity of the rigid dielectric layer comprising glass fibers and resin is relatively high.

The heat-dissipating element 214 is disposed on the circuit board 212 and covers one side of the through opening 212a. The heat-dissipating element 214 comprises a heat-dissipating plate 214a, an adhesive layer 214b, and an antioxidation layer 214c. The heat-dissipating plate 214a has a first surface S1 facing the through opening 212a and a second surface S2 opposing the first surface S1. In this embodiment, the heat-dissipating plate 214a, for example, is a metal foil made of copper and 3 to 100 microns thick.

The adhesive layer 214b is disposed on the first surface Si of the heat-dissipating plate 214a. The heat-dissipating plate 214a adheres to the rigid dielectric layer 212d of the circuit board 212 via the adhesive layer 214b. In this embodiment, the adhesive layer 214b and the heat-dissipating plate 214a may together form a resin coated copper foil. That is to say, the heat-dissipating plate 214a, for example, is a copper foil layer of the resin coated copper foil, and the adhesive layer 214b, for example, is a resin layer of the resin coated copper foil. In another embodiment, the adhesive layer 214b is made of heat conductive glue with a high thermal conductivity coefficient.

The antioxidation layer 214c is disposed on the second surface S2 of the heat-dissipating plate 214a. In this embodiment, the antioxidation layer 214c may be a solidified resin layer made of a C-stage resin which can be cured when heated up. The antioxidation layer 214c may be made of a photosensitive resin which can be cured when irradiated with ultraviolet light. In another embodiment, the antioxidation layer 214c may be a metal layer made of gold which is not oxidized readily or aluminum which is oxidized readily but mitigates the oxidation by forming a dense layer of aluminum oxide on the surface thereof to prevent portion of the metal layer below the dense layer of aluminum oxide from further oxidization.

For example, the electronic element 220 is a chip mounted on the adhesive layer 214b of the heat-dissipating element 214. The electronic element 220 is at least partially located in the through opening 212a of the circuit board 212. The electronic element 220 is electrically connected to the circuit board 212. In this embodiment, the electronic assembly 200 further comprises a plurality of bonding wires 230 and the electronic element 220 such as a chip may be electrically connected to the circuit board 212 through the bonding wires 230. In other words, for example, the electronic element 220 such as a chip is electrically connected to the circuit board 212 by means of wire bonding technology.

The package substrate 210 has the heat-dissipating element 214 corresponding to the through opening 212a of the circuit board 212. The electronic element 220 is located in the through opening 212a and on the heat-dissipating element 214. Hence, in view of the trend toward miniaturized electronic products, the heat dissipation efficiency of the electronic element 220 of the electronic assembly 200 of this embodiment is enhanced. In addition, since the heat-dissipating plate 214a of the heat-dissipating element 214 can be a metal foil, the total weight of the package substrate 210 of this embodiment can be reduced. Furthermore, since the heat-dissipating element 214 has the antioxidation layer 214c disposed on the heat-dissipating plate 214a, the heat-dissipating plate 214a is protected by the antioxidation layer 214c and thus unlikely to come into contact with ambient moisture to oxidize.

FIG. 2A through FIG. 2F are schematic views showing a method for manufacturing the electronic assembly of FIG. 1. First, referring to FIG. 2A, the circuit board 212 having the through opening 212a is provided. Next, referring to FIG. 2B, the heat-dissipating plate 214a having the first surface S1 and the second surface S2 opposing the first surface Si is provided. Next, referring to FIG. 2C, the adhesive layer 214b is formed on the first surface Si of the heat-dissipating plate 214a. In this embodiment, after the steps depicted in FIG. 2B and FIG. 2C, the heat-dissipating plate 214a and the adhesive layer 214b can together form a resin coated copper foil. In another embodiment, in the step illustrated with FIG. 2C, a heat conductive glue with a high thermal conductivity coefficient is disposed on the first surface S1 of the heat-dissipating plate 214a to form the adhesive layer 214b. In another embodiment, in the step illustrated with FIG. 2C, an A-stage resin is applied to the first surface S1 of the heat-dissipating plate 214a and then heated up to turn into a B-stage resin to form the adhesive layer 214b.

Figure 2A:
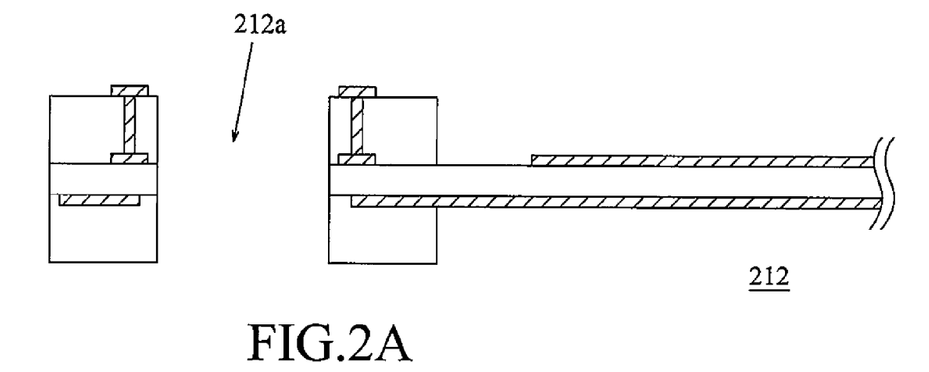
FIG. 2A through FIG. 2F are schematic views showing a method for manufacturing the electronic assembly of FIG. 1.
Figures 2B, 2C:
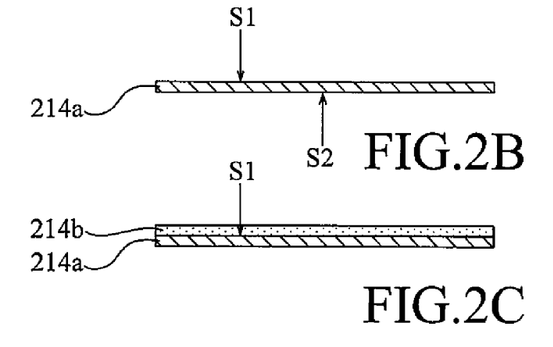
Figure 2D:
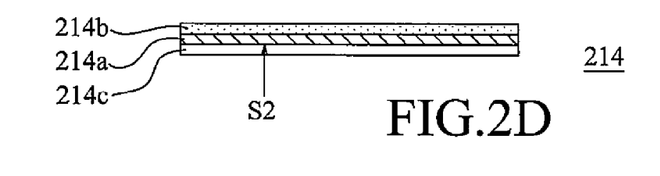

Next, referring to FIG. 2D, the antioxidation layer 214c is formed on the second surface S2 of the heat-dissipating plate 214a, wherein the heat-dissipating plate 214a, the adhesive layer 214b, and the antioxidation layer 214c together form the heat-dissipating element 214. In this embodiment, the A-stage resin is applied to the second surface S2 of the heat-dissipating plate 214a and heated up to turn into the B-stage resin, and then the B-stage resin is heated up to turn into the C-stage resin to form the antioxidation layer 214c. In another embodiment, the antioxidation layer 214c is made of metal, and the antioxidation layer 214c can be formed on the second surface S2 of the heat-dissipating plate 214a by electroplating, sputtering, physical vapor deposition, or chemical vapor deposition.

Figure 2E:
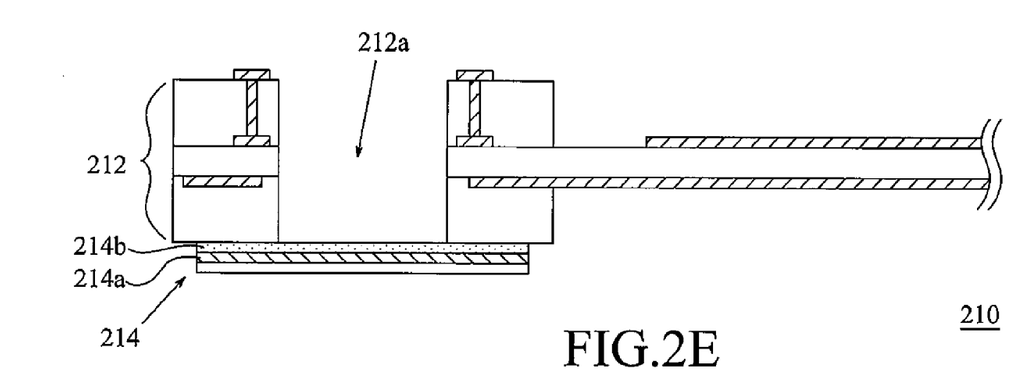
Figure 2F:
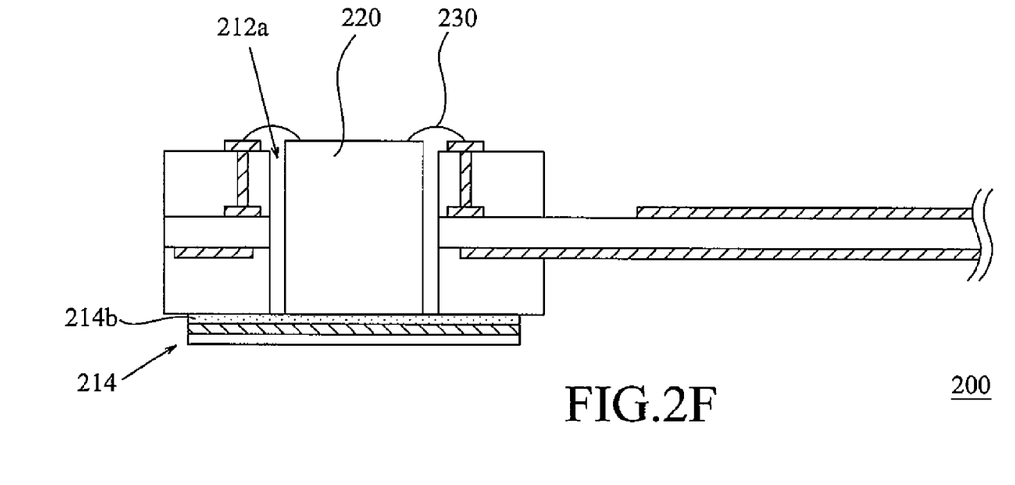

Next, referring to FIG. 2E, the heat-dissipating plate 214a adheres to the circuit board 212 by means of the adhesive layer 214b such that the heat-dissipating element 214 covers one side of the through opening 212a of the circuit board 212 to thereby finalize the manufacturing of the package substrate 210. In this step, the heat-dissipating element 214 can adhere to the rigid dielectric layer 212d of the circuit board 212 by pressing. Next, referring to FIG. 2F, the electronic element 220 such as a chip is disposed in the through opening 212a and on the adhesive layer 214b of the heat-dissipating element 214. Finally, referring to FIG. 2F, the electronic element 220 such as a chip is electrically connected to the circuit board 212 by means of wire bonding technology. After the said steps, the electronic assembly 200 is eventually formed.

[Second Embodiment]

Figure 3:
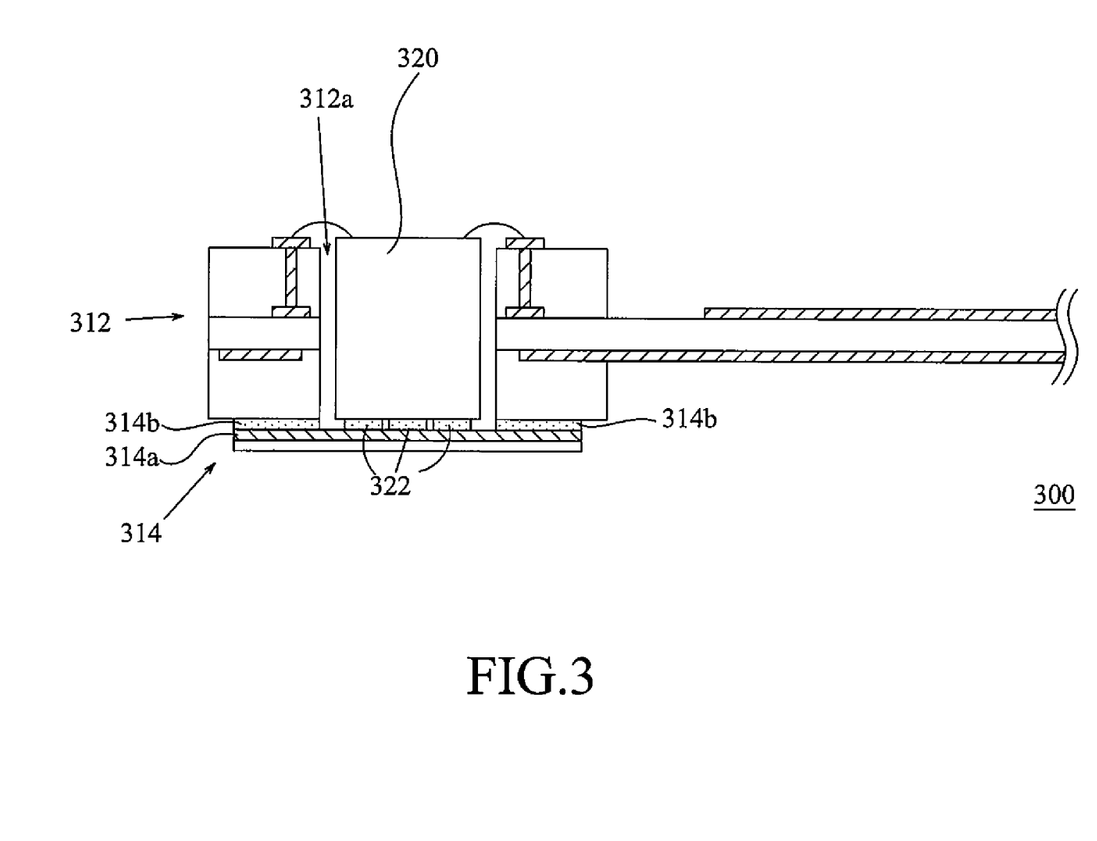
FIG. 3 is a schematic cross-sectional view of an electronic assembly according to the second embodiment of the present invention.

FIG. 3 is a schematic cross-sectional view of an electronic assembly according to the second embodiment of the present invention. Referring to FIG. 3, the differences between an electronic assembly 300 of the second embodiment and the electronic assembly 200 of the first embodiment are that an adhesive layer 314b of a heat-dissipating element 314 of the second embodiment is located between a heat-dissipating plate 314a and a circuit board 312 to expose a portion of the heat-dissipating plate 314a corresponding to a through opening 312a of the circuit board 312 and that an electronic element 320 is disposed on the exposed portion of the heat-dissipating plate 314a by means of another adhesive layer 322.

Figures 4A, 4B, 4C:
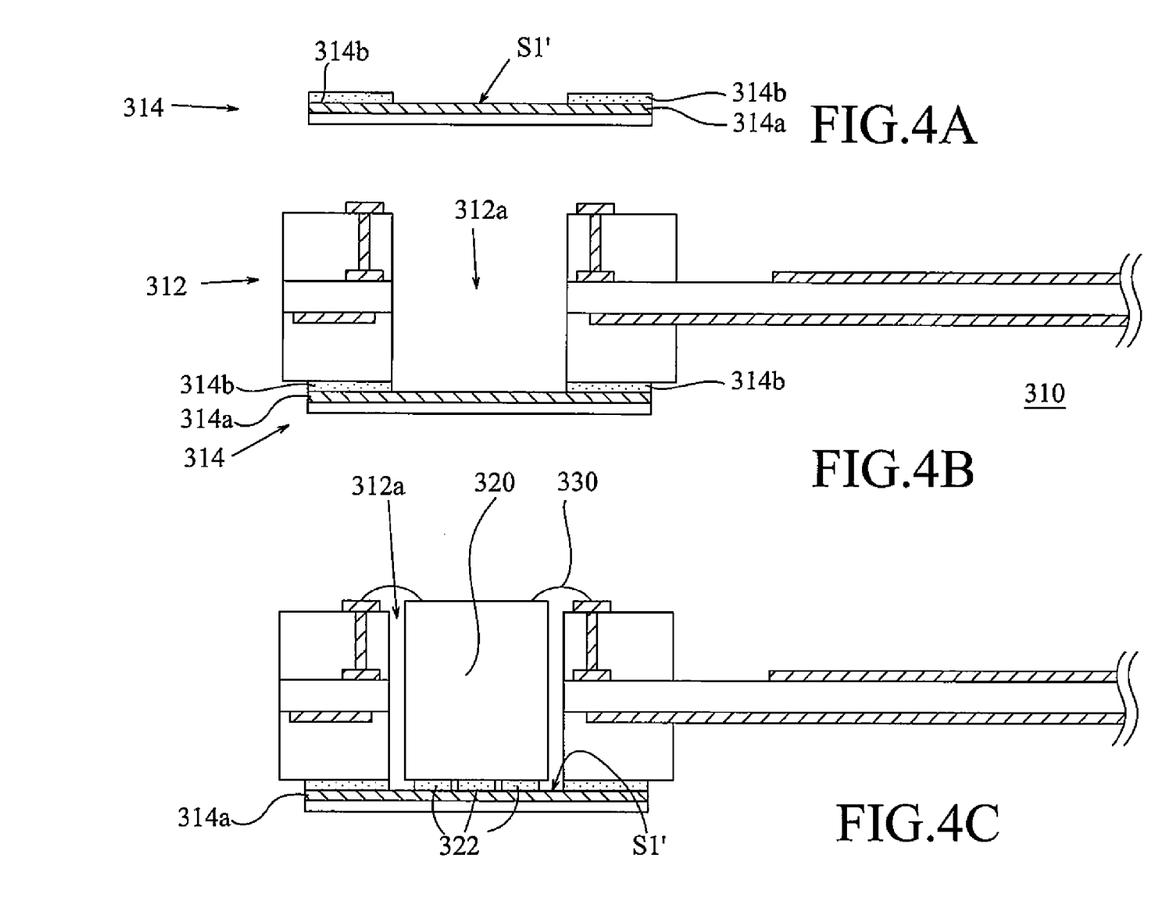
FIG. 4A through FIG. 4C are schematic views of a portion of the steps of the method for manufacturing the electronic assembly of FIG. 3.

FIG. 4A through FIG. 4C are schematic views of a portion of the steps of the method for manufacturing the electronic assembly of FIG. 3. The process of forming the heat-dissipating element 314 of this embodiment can be referred to the process of forming the heat-dissipating element 214 shown in FIG. 2B through FIG. 2D in the first embodiment and therefore, further explanation is omitted. Referring to FIG. 4A, after the heat-dissipating element 314 has been formed, a portion of the adhesive layer 314b of the heat-dissipating element 314 is removed such that a portion of the first surface S1' of the heat-dissipating plate 314a is exposed. Next, referring to FIG. 4B, the heat-dissipating plate 314a adheres to the circuit board 312 by means of the adhesive layer 314b such that the heat-dissipating element 314 covers one side of the through opening 312a of the circuit board 312 to thereby finalize the manufacturing of a package substrate 310.

Next, referring to FIG. 4C, the electronic element 320 such as a chip where an adhesive layer 322 is formed beforehand by means of dispensing is disposed in the through opening 312a and on the first surface S1' of the heat-dissipating plate 314a. Finally, referring to FIG. 4C, the electronic element 320 such as a chip is electrically connected to the circuit board 312 by wire bonding technology.

The electronic assembly and the package substrate thereof according to one of the embodiments of the present invention at least have one of the following advantages or other advantages. The package substrate has the heat-dissipating element corresponding to the through opening of the circuit board. The electronic element is located in the through opening and on the heat-dissipating element. Hence, in view of the trend toward miniaturized electronic products, the heat dissipation efficiency of the electronic element of the electronic assembly of this embodiment of the present invention is enhanced. In addition, since the heat-dissipating plate of the heat-dissipating element can be a metal foil, the total weight of the package substrate of this embodiment can be reduced. Furthermore, since the heat-dissipating element has the antioxidation layer disposed on the heat-dissipating plate, the heat-dissipating plate is protected by the antioxidation layer and thus unlikely to come into contact with ambient moisture to oxidize.

The foregoing detailed description of the embodiments is used to further clearly describe the features and spirit of the present invention. The foregoing description for each embodiment is not intended to limit the scope of the present invention. All kinds of modifications made to the foregoing embodiments and equivalent arrangements should fall within the protected scope of the present invention. Hence, the scope of the present invention should be explained most widely according to the claims described thereafter in connection with the detailed description, and should cover all the possibly equivalent variations and equivalent arrangements.

The invention claimed is:

1. A package substrate, comprising:
    a circuit board, having a through opening adapted for accommodating an electronic element; and
    a heat-dissipating element, disposed at the circuit board and covering one side of the through opening and only contacting a dielectric material of a dielectric layer of the circuit board, the heat-dissipating element comprising:
        a heat-dissipating plate, having a first surface facing the through opening and a second surface opposite to the first surface;
        an adhesive layer, disposed on the first surface, wherein the heat-dissipating plate adheres to the dielectric material of the dielectric layer of the circuit board through the adhesive layer; and
        an antioxidation layer, disposed on the second surface.

2. The package substrate as claimed in claim 1, wherein the heat-dissipating plate is a metal foil of which a thickness is between 3 to 100 microns.

3. The package substrate as claimed in claim 1, wherein the adhesive layer is a heat conductive adhesive layer.

4. The package substrate as claimed in claim 1, wherein the antioxidation layer is a metal layer.

5. The package substrate as claimed in claim 1, wherein the antioxidation layer is a solidified resin layer.

6. An electronic assembly, comprising:
    a package substrate, comprising:
        a circuit board, having a through opening; and
        a heat-dissipating element, disposed at the circuit board and covering one side of the through opening and only contacting a dielectric material of a dielectric layer of the circuit board, the heat-dissipating element comprising:
            a heat-dissipating plate, having a first surface facing the through opening and a second surface opposite to the first surface;
            an adhesive layer, disposed on the first surface, wherein the heat-dissipating plate adheres to the dielectric material of the dielectric layer of the circuit board through the adhesive layer; and
            an antioxidation layer, disposed on the second surface; and
    an electronic element, disposed on the heat-dissipating element, at least partially located in the through opening and electrically connected to the circuit board.

7. The electronic assembly as claimed in claim 6, wherein the heat-dissipating plate is a metal foil of which a thickness is between 3 to 100 microns.

8. The electronic assembly as claimed in claim 6, wherein the adhesive layer is a heat conductive adhesive layer.

9. The electronic assembly as claimed in claim 6, wherein the antioxidation layer is a metal layer.

10. The electronic assembly as claimed in claim 6, wherein the antioxidation layer is a solidified resin layer.

11. A package substrate, comprising:
    a circuit board, having a through opening adapted for accommodating an electronic element; and
    a heat-dissipating element, disposed at the circuit board and covering one side of the through opening, comprising:
        a heat-dissipating plate, having a first surface facing the through opening and a second surface opposite to the first surface;
        an adhesive layer, disposed on the first surface, wherein the heat-dissipating plate adheres to the circuit board through the adhesive layer, and the adhesive layer and the heat-dissipating plate together form a resin coated copper foil; and
        an antioxidation layer, disposed on the second surface.

12. The package substrate as claimed in claim 11, wherein the heat-dissipating plate is a metal foil of which a thickness is between 3 to 100 microns.

13. The package substrate as claimed in claim 11, wherein the adhesive layer is a heat conductive adhesive layer.

14. The package substrate as claimed in claim 11, wherein the antioxidation layer is a metal layer.

15. The package substrate as claimed in claim 11, wherein the antioxidation layer is a solidified resin layer.

* * * * *